United States Patent
Kawasumi

(10) Patent No.: US 9,934,835 B2
(45) Date of Patent: Apr. 3, 2018

(54) SEMICONDUCTOR DEVICE CAPABLE OF REDUCING POWER CONSUMPTION

(71) Applicant: KABUSHIKI KAISHA TOSHIBA, Minato-ku (JP)

(72) Inventor: Atsushi Kawasumi, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 56 days.

(21) Appl. No.: 14/638,269

(22) Filed: Mar. 4, 2015

(65) Prior Publication Data
US 2016/0035405 A1 Feb. 4, 2016

(30) Foreign Application Priority Data
Jul. 31, 2014 (JP) .................................. 2014-156721

(51) Int. Cl.
G11C 11/16 (2006.01)
G11C 5/14 (2006.01)

(52) U.S. Cl.
CPC .......... *G11C 11/1697* (2013.01); *G11C 5/148* (2013.01); *G11C 11/1655* (2013.01); *G11C 11/1657* (2013.01); *G11C 11/1659* (2013.01); *G11C 11/1673* (2013.01); *G11C 11/1693* (2013.01); *G11C 5/147* (2013.01)

(58) Field of Classification Search
CPC ... G11C 8/08; G11C 11/4085–11/4087; G11C 11/415; G11C 11/418; G11C 14/0081
See application file for complete search history.

(56) References Cited

U.S. PATENT DOCUMENTS

| | | | | |
|---|---|---|---|---|
| 5,274,601 A | * | 12/1993 | Kawahara | ................ G11C 5/14 327/427 |
| 7,082,053 B1 | * | 7/2006 | Jenne | ................ G11C 14/0081 365/158 |
| 7,697,365 B2 | * | 4/2010 | Tran | ....................... G11C 16/28 365/185.27 |
| 8,223,581 B2 | | 7/2012 | Kawasumi | |
| 9,484,083 B2 | * | 11/2016 | Moriwaki | ................ G11O 5/02 |

(Continued)

FOREIGN PATENT DOCUMENTS

JP 09-064295 A 3/1997
JP 2002-42476 2/2002
(Continued)

*Primary Examiner* — Harry W Byrne
*Assistant Examiner* — R Lance Reidlinger
(74) *Attorney, Agent, or Firm* — Oblon, McClelland, Maier & Neustadt, L.L.P.

(57) ABSTRACT

According to one embodiment, a semiconductor device includes a first transistor of a first conductivity type, and a first logical circuit. The first transistor of the first conductivity type is connected between a first node to which a power supply voltage is applied and a second node. The first transistor is turned on in the initial stage of an active cycle, and is turned off by applying the power supply voltage to the second node. The first logical circuit is driven by the power supply voltage applied to the second node. The first logical circuit outputs a voltage which is lower than the power supply voltage in the active cycle based on an input signal supplied thereto.

19 Claims, 7 Drawing Sheets

(56) References Cited

U.S. PATENT DOCUMENTS

| 2008/0037358 | A1* | 2/2008 | Yabuuchi | G11O 5/147 |
| | | | | 365/230.06 |
| 2012/0170390 | A1* | 7/2012 | Idgunji | G11C 7/222 |
| | | | | 365/194 |
| 2015/0371686 | A1* | 12/2015 | Van Winkelhoff | G11C 11/418 |
| | | | | 365/189.011 |

FOREIGN PATENT DOCUMENTS

| JP | 2007-66493 | 3/2007 |
| JP | 2010-152974 A | 7/2010 |
| JP | 2012-33219 | 2/2012 |

* cited by examiner

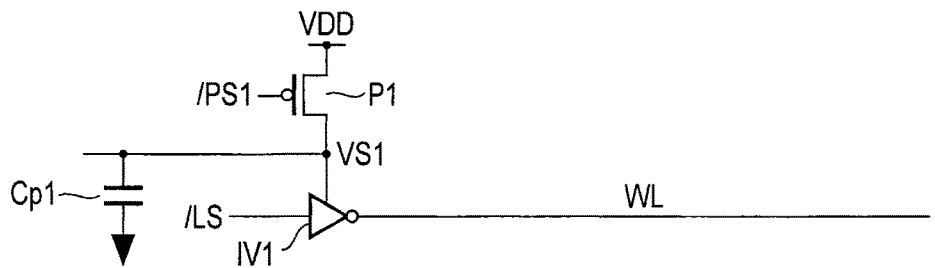
F I G. 2
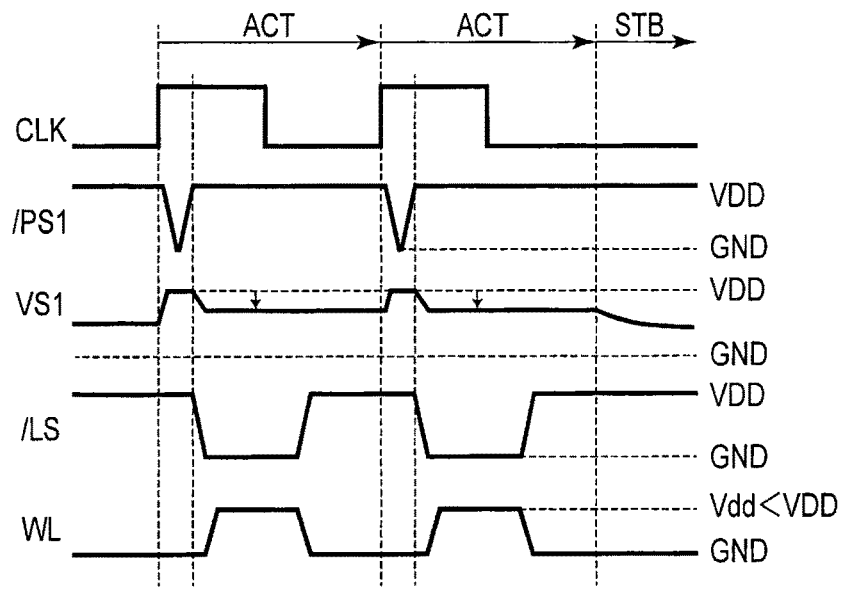
F I G. 3
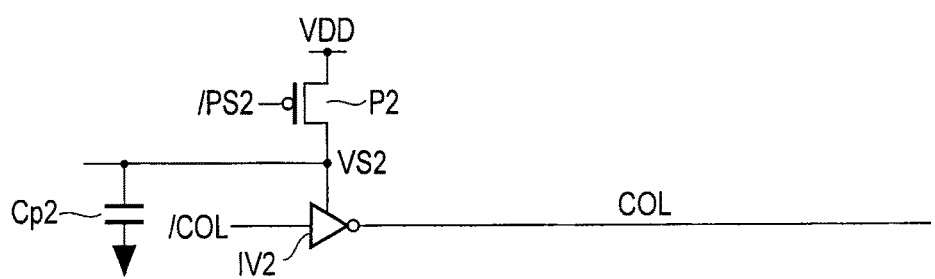
F I G. 4

US 9,934,835 B2

SEMICONDUCTOR DEVICE CAPABLE OF REDUCING POWER CONSUMPTION

CROSS-REFERENCE TO RELATED APPLICATIONS

This application is based upon and claims the benefit of priority from Japanese Patent Application No. 2014-156721, filed Jul. 31, 2014, the entire contents of which are incorporated herein by reference.

FIELD

Embodiments described herein relate generally to a semiconductor device applied to, for example, normally-off computing.

BACKGROUND

Normally-off computing can reduce consumption of power in a standby state, utilizing a nonvolatile memory and power gating. As the nonvolatile memory, an MRAM (magnetoresistive random access memory) free from leak paths in the standby state is used.

BRIEF DESCRIPTION OF THE DRAWINGS

FIG. 2 is a circuit diagram showing an example of a row decoder according to the first embodiment;

FIG. 3 is a waveform chart showing an operation of the row decoder;

FIG. 4 is a circuit diagram showing a case where the first embodiment is applied to a column decoder;

DETAILED DESCRIPTION

In general, according to one embodiment, a semiconductor device includes a first transistor of a first conductivity type, and a first logical circuit. The first transistor of the first conductivity type is connected between a first node to which a power supply voltage is applied, and a second node. The first transistor is turned on in the initial stage of an active cycle, and is turned off by applying the power supply voltage to the second node. The first logical circuit is driven by the power supply voltage applied to the second node. The first logical circuit outputs a voltage which is lower than the power supply voltage in the active cycle based on an input signal supplied thereto.

Since MRAMs are normally-off devices and hence have no leak paths in a standby state, they exhibit low consumption of power. However, peripheral circuits of the MRAM have leak paths, and hence there is a demand for suppressing power consumption in the standby state.

Embodiments will be described with reference to the accompanying drawings.

First Embodiment

Figure 1:
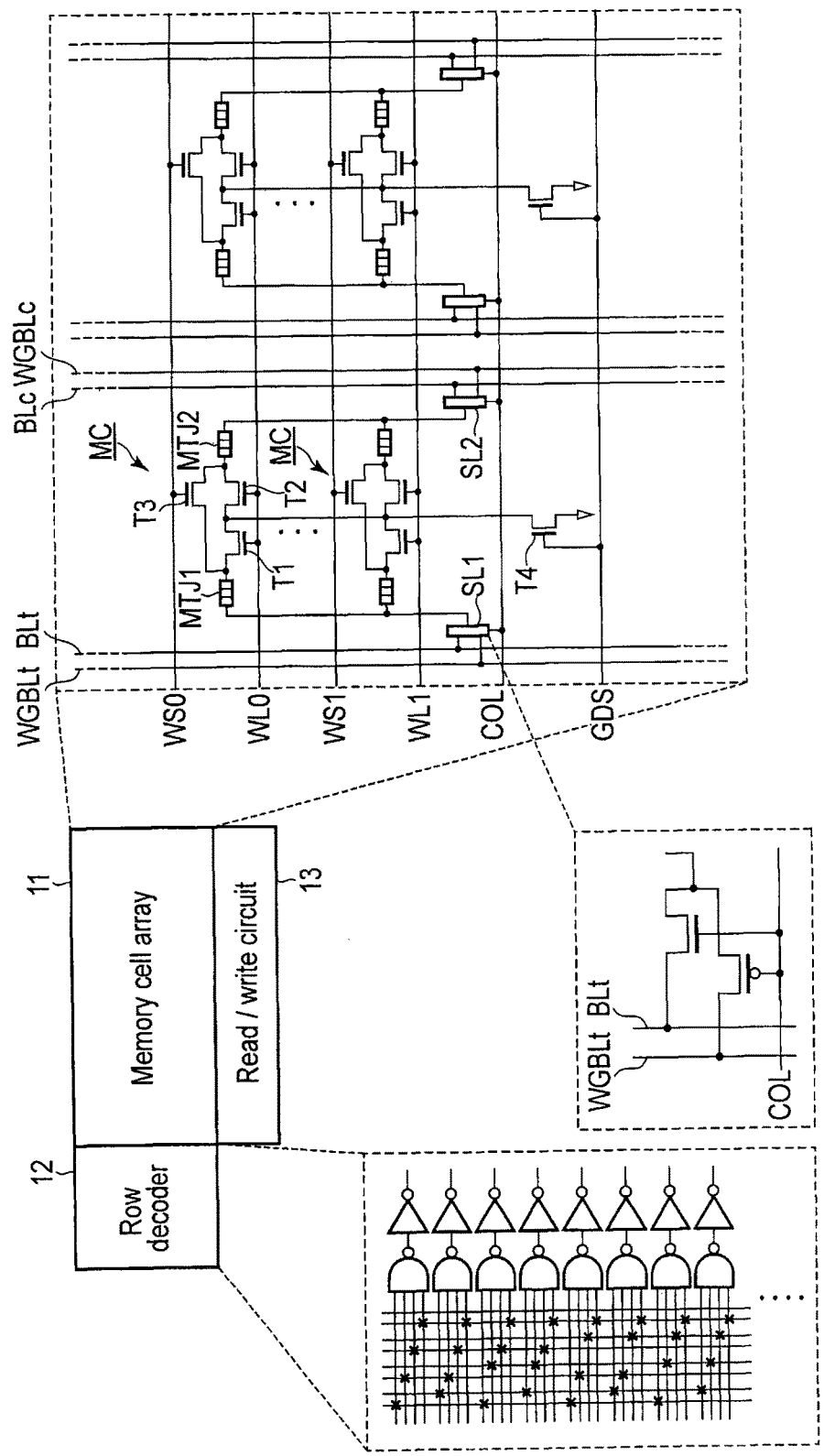
FIG. 1 is a block diagram schematically showing an example of a semiconductor device according to a first embodiment.

FIG. 1 shows an example of a nonvolatile memory formed of an MRAM according to a first embodiment. As shown, a memory cell array 11 comprises a plurality of memory cells MC arranged in a matrix. A row decoder 12 and a read/write circuit 13 are provided in periphery of the memory cell array 11.

In the memory cell array 11, each memory cell MC comprises first and second magnetoresistive effect elements (hereinafter referred to as MTJ elements) MTJ1 and MTJ2, and first, second and third N-channel MOS transistors (hereinafter referred to as NMOS transistors) T1, T2 and T3. Since the memory cells MC have the same structure, only the memory cell MC connected to local word line WL0 will be described.

First and second MTJ elements MTJ1 and MTJ2 each comprise a reference layer, a tunnel barrier layer and a storage layer stacked on each other. The reference layers of first and second MTJ elements MTJ1 and MTJ2 are connected to first and second selectors SL1 and SL2, respectively. First selector SL1 selects a write global bit line WGBLt or a local bit line BLt based on a signal in a column select line COL. Second selector SL2 selects a write global bit line WGBLc or a local bit line BLc based on a signal in the column select line COL.

The storage layers of first and second MTJ elements MTJ1 and MTJ2 are connected to each other via first and second NMOS transistors T1 and T2. The gate electrodes of first and second NMOS transistors T1 and T2 are connected to word line WL0.

Further, the connection node of first and second NMOS transistors T1 and T2 are connected to an end of the current path of fourth NMOS transistor T4. The other end of fourth NMOS transistor T4 is grounded, and signal GDS is supplied to the gate electrode of the transistor T4.

Yet further, third NMOS transistor T3 is connected between first and second MTJ elements MTJ1 and MTJ2 in parallel with first and second NMOS transistors T1 and T2. Signal WS0 is supplied to the gate electrode of third NMOS transistor T3. During data writing, third NMOS transistor T3 is turned on by signal WS0, simultaneously with first and second NMOS transistors T1 and T2, thereby preventing reduction of a write current passing through first and second NMOS transistors T1 and T2.

During data writing, the row decoder 12 selectively sets word lines WL0, WL1, and signals WS0, WS1, ... to a high level, thereby selecting a write target row from the plurality of memory cells MC arranged in the memory cell array 11. During data reading, the row decoder 12 selectively sets word lines WL0, WL1, ... and signal GDS to the high level, thereby selecting a read target row from the plurality of memory cells MC arranged in the memory cell array 11.

The read/write circuit 13 supplies write data to write global bit lines WGBLt and WGBLc during data writing, and detects the data read from a memory cell MC to local bit liens BLt and BLc during data reading.

(Write Operation)

In the above-described structure, during data writing, signal COL is set to, for example, the high level, whereby write global bit lines WGBLt and WGBLc are selected by selectors SL1 and SL2, respectively. After that, the row decoder 12 sets word line WL0 and signal WS0 to the high level. At this time, signal GDS is set to a low level.

For instance, when data in write global bit line WGBLt is "1" (high level), and data in write global bit line WGBLc is "0" (such a low level as a negative voltage), if word line WL0 and signal WS0 are set to the high level, transistors T1, T2 and T3 are turned on. Accordingly, a current flows from the write global bit line WGBLt side to the write global bit line WGBLc side through the first MTJ element MTJ1, transistors T1, T2, T3 and the second MTJ element MTJ2. As a result, data "1" is written to first MTJ element MTJ1, and data "0" is written to second MTJ element MTJ2.

In contrast, when data in write global bit line WGBLt is "0" (such a low level as a negative voltage), and data in write global bit line WGBLc is "1" (high level), data "1" is written to second MTJ 2, and data "0" is written to first MTJ 1. The resistance of the MTJ element with data "1" is set greater than that of the MTJ element with data "0."

(Reading Operation)

During data reading, signal COL is set to, for example, the low level, whereby bit lines BLt and BLc are selected by selectors SL1 and SL2, respectively. As a result, bit lines BLt and BLc are both pre-charged at the high level. After that, word line WL0 and signal GDS are set to the high level and signal WS0 is set to the low level by the row decoder 12. Accordingly, first, second and fourth NMOS transistors T1, T2 and T4 are turned on. At this time, the charges in local bit lines BLt and BLc flow through first and second MTJ elements MTJ1 and MTJ2 and first, second and fourth NMOS transistors T1, T2 and T4.

At this time, if, for example, data "0" is set in first MTJ element MTJ1 and data "1" is set in second MTJ element MTJ2, the resistance of second MTJ element MTJ2 is greater than that of first MTJ element MTJ1. Accordingly, a greater amount of current flows between first MTJ element MTJ1 and the ground than between second MTJ element MTJ2 and the ground. This difference in the currents flowing through local bit lines BLt and BLc is detected by a sense amplifier, described later.

The memory cell array 11 including memory cells MC formed of first and second MTJ elements MTJ1 and MTJ2 does not have any leak path, since no power supply is included therein. In contrast, the row decoder 12 and the read/write circuit 13 include power supplies and hence include leak paths. Therefore, it is necessary to reduce the leak current in the row decoder 12 and the read/write circuit 13.

(Structure of Row Decoder)

FIG. 2 shows part of the row decoder 12 in the first embodiment.

In FIG. 2, P-channel MOS transistor (hereinafter referred to as PMOS transistor) P1 as a power switch is connected between a node supplied with power supply voltage VDD and virtual power supply node VS1. Pulse signal/PS1 is supplied to the gate electrode of PMOS transistor P1. Capacitor Cp1 is connected between virtual power supply node VS1 and the ground. Capacitor Cp1 is formed of a MOS capacitor, or a combination of the MOS capacitor and a parasitic capacitance.

Inverter circuit IV1 is connected to virtual power supply node VS1. Inverter circuit IV1 is driven by power supplied from virtual power supply node VS1. The input terminal of inverter circuit IV1 receives signal/LS from the address decoder portion of the row decoder 12 shown in FIG. 1. The output terminal of inverter circuit IV1 is connected to a word line WL.

(Operation of Row Decoder)

FIG. 3 shows the operation of the row decoder.

As shown in FIG. 3, an MRAM executes data write and read in synchronism with clock signal CLK. When the MRAM has shifted to active cycle (also called active state) ACT, pulse signal/PS1 changes from the high level to the low level for a short period of time in the initial stage of the active cycle. As a result, PMOS transistor P1 is kept in the on state for the short period of time, whereby virtual power supply node VS1 is charged with power supply voltage VDD.

After signal/PS1 is returned to the high level, signal/LS changes from the high level to the low level. Accordingly, the word line WL connected to the output terminal of inverter circuit IV1 is set to the high level.

After signal/PS1 is returned to the high level, signal/LS is set to the low level. Therefore, when the level of inverter circuit IV1 is inverted, the supply of power from PMOS transistor P1 to virtual power supply node VS1 is already cut off. As a result, the charge of virtual power supply node VS1 is shared between the node VS1 itself and the word line WL, and hence the voltage level of the word lines WL is Vdd which is lower than power supply voltage VDD. In other words, whenever active cycle ACT is performed, the voltage of virtual power supply node VS1 is lowered to a voltage lower than power supply voltage VDD.

The above-described operation is performed in each active cycle ACT of the MRAM, and signal/LS is made active in the order of address, whereby each memory cell MC is selected in which a write or read operation is performed.

In contrast, when the above-described active cycle ACT is completed and the state is shifted to a standby state (STB) as shown in FIG. 3, signal/LS is set to the high level and the word line WL is set to the low level. At this time, signal/PS1 is already set at the high level. Therefore, PMOS transistor P1 is in the off state, and the supply of power to virtual power supply node VS1 is cut off. Accordingly, the potential at virtual power supply node VS1 is gradually reduced since the charge is discharged through leak paths, such as the gate leak, channel leak and conjunction leak of the PMOS transistor that provides inverter circuit IV1. However, when the PMOS transistor is completely non-conducting, the leak current is blocked off, and the potential of virtual power supply node VS1 is kept above the ground potential. Namely, all charge of virtual power supply node VS1 is retained without discharge. Consequently, when the MRAM is returned to the active state, the charge of virtual power supply node VS1 is reused and is quickly charged with power supply voltage VDD.

(Read/Write Circuit 13)

FIG. 4 shows a case where the first embodiment is applied to a column decoder (not shown) in the read/write circuit 13.

In FIG. 4, P-channel MOS transistor P2 is connected between the node supplied with power supply voltage VDD and virtual power supply node VS2. Pulse signal/PS2 is supplied to the gate electrode of PMOS transistor P2. Capacitor Cp2 is connected between virtual power supply node VS2 and the ground.

Further, inverter circuit IV2 is connected to virtual power supply node VS2. Inverter circuit IV2 is driven by power supplied from virtual power supply node VS2. The input terminal of inverter circuit IV2 receives signal/COL from the address decoder portion (not shown) of the column decoder. The output terminal of inverter circuit IV2 is connected to column selection line COL.

(Operation of Column Decoder)

Figure 5:
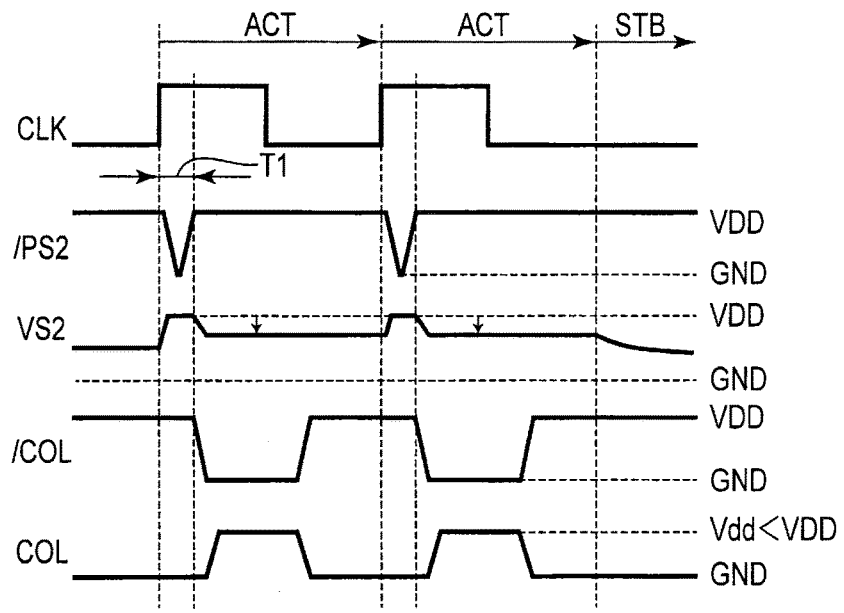
FIG. 5 is a waveform chart showing an operation example of the column decoder.

FIG. 5 shows the operation of the column decoder shown in FIG. 4. The operation shown in FIG. 5 is basically similar to the operation of the row decoder shown in FIG. 3. For instance, when data is read from a memory cell MC, if the MRAM becomes active cycle ACT in accordance with clock signal CLK, pulse signal/PS2 changes from the high level to the low level for a short period of time in the initial stage of the active cycle. As a result, PMOS transistor P2 is kept in the on state for the short period of time, whereby virtual power supply node VS2 is charged with power supply voltage VDD.

After signal/PS2 is returned to the high level, signal/COL changes from the high level to the low level. Accordingly, the column selection line COL connected to the output terminal of inverter circuit IV2 is set to the high level.

After signal/PS2 is returned to the high level, signal/COL is set to the low level. Therefore, when the level of inverter circuit IV2 is inverted, the supply of power from PMOS transistor P2 to virtual power supply node VS2 is already cut off. At this time, charge sharing occurs, thereby raising the voltage at column selection line COL to the high level, and reducing the voltage of virtual power supply node VS2 to Vdd which is lower than power supply voltage VDD. Thus, the voltage at column selection line COL is raised to the high level whenever active cycle ACT is performed, whereby virtual power supply node VS2 is lowered to Vdd lower than power supply voltage VDD.

Since the voltage at column selection line COL is set to Vdd which is lower than power supply voltage VDD, the current driving force of the NMOS transistors forming selectors SL1 and SL2 is reduced. As a result, the amounts of current flowing through bit lines BLt and BLc during, for example, data reading can be reduced. This enables the currents in the bit lines to be restricted without using a clamp circuit, thereby preventing read disturb, as will be described later.

In contrast, when the state is shifted to the standby state (STB) after the above-mentioned active cycle ACT is completed, signal/COL is set to the high level and the column selection line COL is set to the low level, as is shown in FIG. 5. At this time, signal/PS2 is already set at the high level. Therefore, PMOS transistor P2 is in the off state, and the supply of power to virtual power supply node VS2 is cut off. Accordingly, the potential at virtual power supply node VS2 is gradually lowered since the charge is discharged through leak paths, such as the gate leak, channel leak and conjunction leak of the PMOS transistor that provides inverter circuit IV12. However, when the PMOS transistor is completely non-conducting, the leak current is cut off, and the potential of virtual power supply node VS2 is kept above the ground potential. Namely, all charge of virtual power supply node VS2 is retained without discharge. Consequently, when the active cycle is performed again, the charge of virtual power supply node VS2 is reused and is quickly charged with power supply voltage VDD.

Incidentally, the current driving force of a transistor varies depending upon variation in semiconductor manufacturing process, power supply voltage and temperature (hereinafter referred to as PVT). For instance, if the threshold voltage of the NMOS transistor is low, the power supply voltage is high and the temperature is low, the pulse width of each signal is narrowed. In contrast, if the threshold voltage of the NMOS transistor is high, the power supply voltage is low and the temperature is high, the pulse width of each signal is widened.

Thus, if the pulse width of, for example, signal/PS2 varies due to variation in PVT, it becomes difficult to keep, constant, a current flowing each bit line and hence to make the read current constant.

In view of the above, in the first embodiment, a pulse generation circuit for generating signal/PS2 is designed to be able to generate signal/PS2 of a constant pulse width regardless of variation in PVT.

Figure 7:
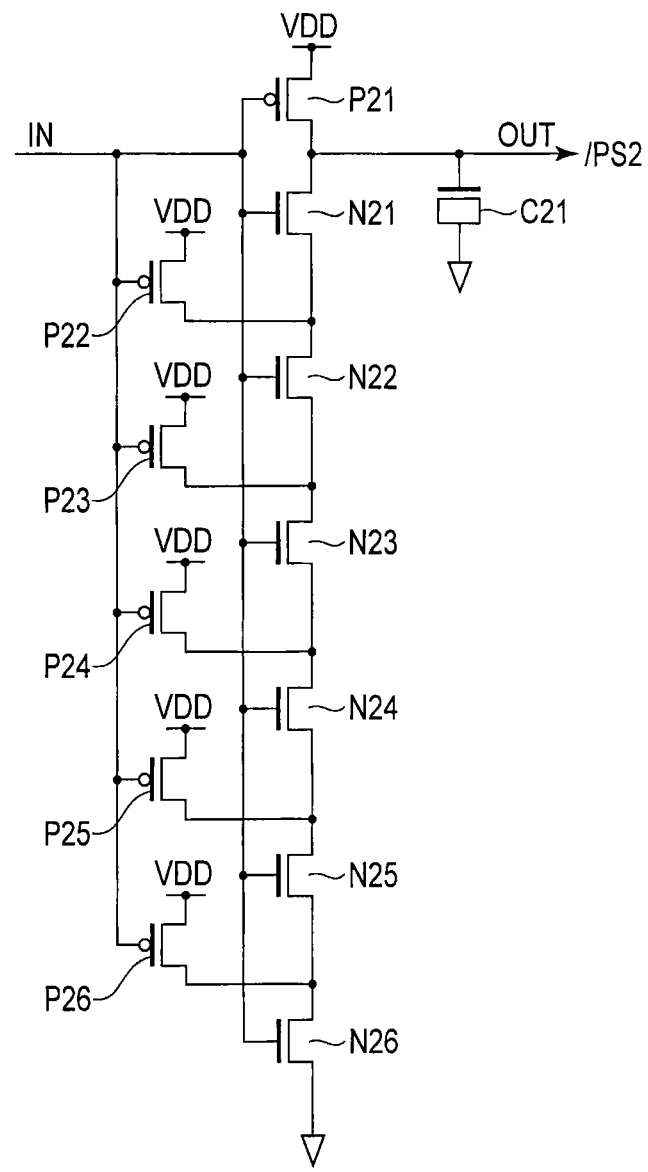
FIG. 7 is a circuit diagram showing a part of a pulse generation circuit according to the first embodiment.

FIG. 7 shows part of a pulse generation circuit according to the first embodiment, and more specifically shows an example of a circuit for suppressing the influence of variation in PVT.

The pulse generation circuit of FIG. 7 is an inverter circuit that comprises PMOS transistor P21 and a plurality of NMOS transistors N21 to N26. Specifically, PMOS transistor P21 and NMOS transistors N21 to N26 are connected in series between a node supplied with power supply voltage VDD and the ground. The gate electrodes of PMOS transistor P21 and NMOS transistors N21 to N26 are connected to input terminal IN, and the connection node of PMOS transistor P21 and NMOS transistor N21 is connected to output terminal OUT. Capacitor C21 is connected between output terminal OUT and the ground. Further, PMOS transistors P22 to P26 are connected between the node supplied with power supply voltage VDD and the respective connection nodes of NMOS transistors N21 to N26. The gate electrodes of PMOS transistors P22 to P26 are connected to input terminal IN.

A pulse signal is supplied from a circuit (not shown) to input terminal IN, and signal/PS2 is output from output terminal OUT. When input terminal IN is at the low level, PMOS transistor P21 is in the on state, and output terminal OUT is at the high level, whereby capacitor C21 is charged. Further, at this time, PMOS transistors P22 to P26 are also in the on state, and the connection nodes of NMOS transistors N21 to N26 are charged with power supply voltage VDD via PMOS transistors P22 to P26.

When input terminal IN is raised to the high level, PMOS transistors P22 to P26 are turned off, and NMOS transistors N21 to N26 are turned on. Accordingly, the charge of capacitor C21 connected to output terminal OUT is discharged via NMOS transistors N21 to N26. Note that NMOS transistors N21 to N26 are manufactured by the same manufacturing process as other circuits, and have similar variation in PVT to other circuits. Therefore, if, for example, NMOS transistors N21 to N26 are manufactured to have a lower threshold voltage than a rated value, a greater amount of current flows through NMOS transistors N21 to N26. As a result, the charge of capacitor C21 is discharged at a higher speed, and the pulse width of pulse signal/PS2 becomes shorter as shown in FIG. 5.

Figure 6:
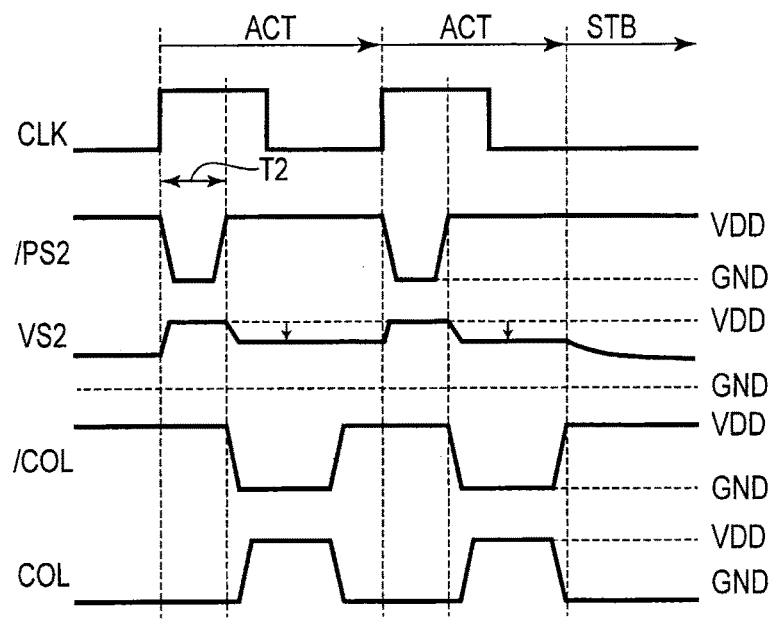
FIG. 6 is a waveform chart showing another operation example of the column decoder.

In contrast, if NMOS transistors N21 to N26 are manufactured to have a higher threshold voltage than the rated value, a smaller amount of current flows through NMOS transistors N21 to N26. As a result, the charge of capacitor C21 is discharged at a lower speed, and the pulse width of pulse signal/PS2 becomes longer as shown in FIG. 6.

As described above, by virtue of the structure of the embodiment, the pulse width of pulse signal/PS2 varies in accordance with variation in PVT, whereby the voltage at column selection line COL can be controlled appropriately to thereby make, constant, the current driving force of the NMOS transistors that form selectors SL1 and SL2. As a result, the current flowing through bit lines BLt and BLc during data reading is kept constant.

Although the circuit shown in FIG. 7 is directed to an example of a pulse generation circuit for generating signal/PS2, it may be applied to a pulse generation circuit for generating signal/PS1.

In the first embodiment, when the state shifts from active cycle ACT to standby state STB during data writing, signal/PS1 is set to the high level before word lines WL0 to WLn become a non-selected state, thereby cutting off the supply of power to virtual power supply node VS1. Accordingly, the leak current can be reduced to thereby reduce the consumption of power in the standby state.

Moreover, in standby state STB, drop of the potential of virtual power supply node VS1 is suppressed by cutting the leak path of the PMOS transistor that forms inverter circuit IV1. Therefore, when the state shifts from standby state STB to active cycle ACT, signal/PS1 is set to the low level, and PMOS transistor P1 is turned on. Accordingly, virtual power supply node VS1 can be quickly returned to power supply voltage VDD to enable high-speed operation.

Further, during data reading, in active cycle ACT, signal/LS associated with the rows is set to the low level after signal/PS1 becomes the high level. Accordingly, when the word line WL is selected, the supply of power from PMOS transistor P1 to virtual power supply node VS1 is already cut off. As a result, the voltage level of the word line WL does not reach power supply voltage VDD because of charge share, but becomes voltage Vdd lower than VDD. Thus, during data reading, the potential of the word line WL is suppressed to Vdd lower than power supply voltage VDD. Accordingly, the current driving force of NMOS transistors T1 and T2 is reduced to thereby reduce the current flowing from bit lines BLt and BLc to first and second MTJ elements MTJ1 and MTJ2 via first and second NMOS transistors T1 and T2. Since the current flowing through first and second MTJ elements MTJ1 and MTJ2 can be thus reduced, data damage during reading (read disturb) can be avoided.

Yet further, during data reading, in active cycle ACT, signal/COL associated with the columns is set to the low level after signal/PS2 becomes the high level. Accordingly, when column selection line COL is selected, the supply of power from PMOS transistor P2 to virtual power supply node VS2 is already cut off. As a result, the voltage level of column selection line COL does not reach power supply voltage VDD because of charge share, but becomes voltage Vdd lower than VDD. Thus, during data reading, since the voltage at column selection line COL is kept at Vdd, the current driving force of the NMOS transistors that form selectors SL1 and SL2 is reduced to thereby reduce the current flowing from bit lines BLt and BLc to first and second MTJ elements MTJ1 and MTJ2 via first and second NMOS transistors T1 and T2. Since the current flowing through first and second MTJ elements MTJ1 and MTJ2 can be reduced, read disturb can be prevented.

Furthermore, since the current flowing from bit lines BLt and BLc to first and second MTJ elements MTJ1 and MTJ2 via first and second NMOS transistors T1 and T2 can be reduced, it is not necessary to provide a clamp circuit for restricting current for the sense amplifier. As a result, the sense amplifier can be simplified in structure.

(Example of Sense Amplifier)

Figure 8A:
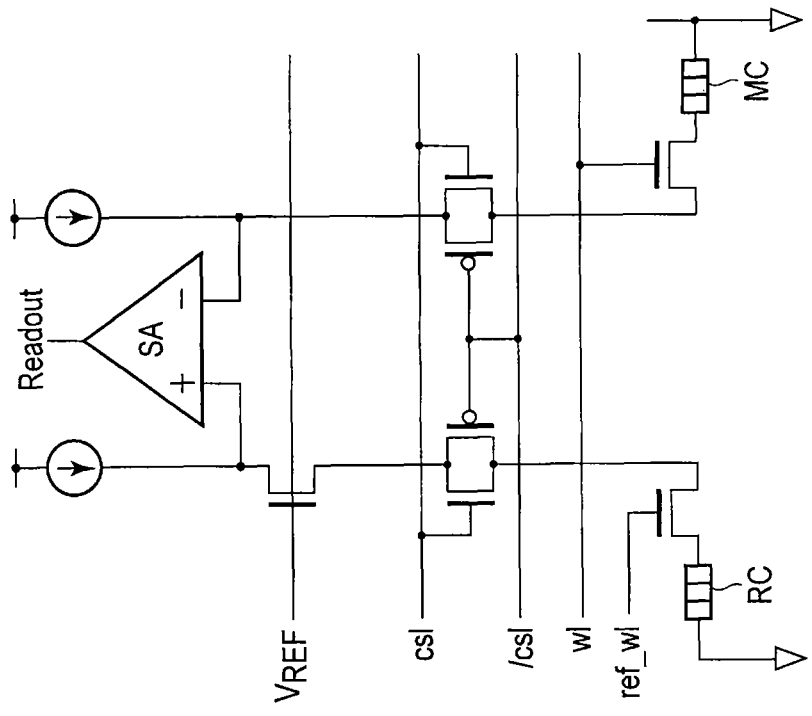
FIG. 8A is a circuit diagram showing a general sense amplifier.
Figure 8B:
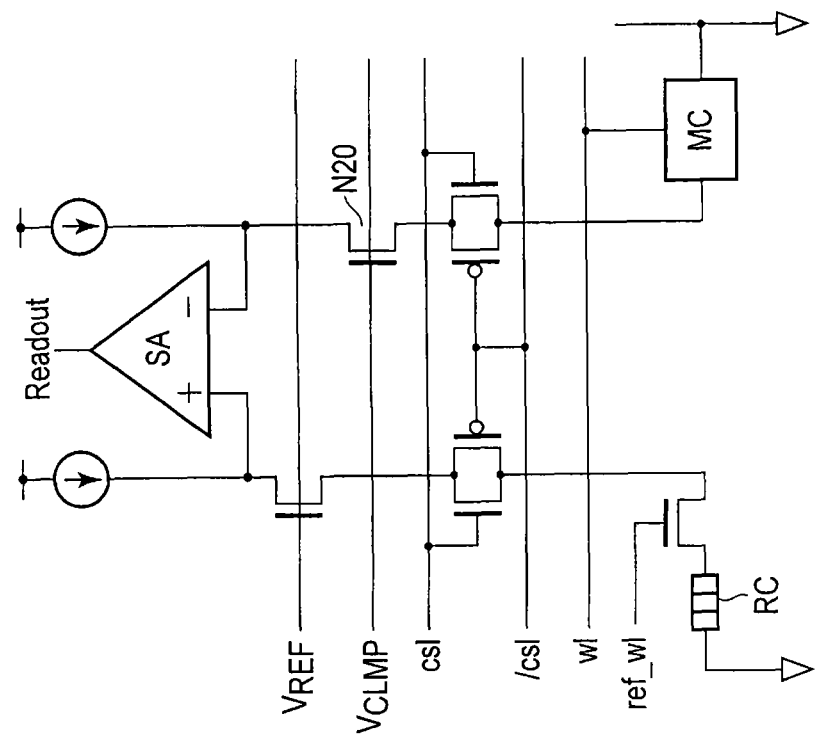
FIG. 8B is a circuit diagram showing a sense amplifier according to the embodiment.

FIGS. 8A and 8B show examples of the sense amplifier for the MRAM. However, the structure of the sense amplifier is not limited to them.

A sense amplifier SA for the MRAM is required to suppress the amount of current flowing through bit lines BLt and BLc, in order to prevent read disturb. To this end, in general, NMOS transistor N20 for clamping is provided in the sense amplifier SA as shown in FIG. 8A.

However, in the first embodiment, the amount of current flowing through bit lines BLt and BLc is suppressed by the voltage at word lines WL0 to WLn and column selection line COL, as described above. Therefore, in the sense amplifier SA of the first embodiment shown in FIG. 8B, NMOS transistor N20 for clamping shown in FIG. 8A can be excluded. This simplifies the structure of the sense amplifier SA.

Second Embodiment

In the above-described first embodiment, the consumption of power in the standby state can be reduced and read disturb can be prevented by controlling the voltage at word lines WL0 to WLn or column selection line COL. In contrast, a second embodiment described below is directed to a case where read disturb is prevented by controlling the voltage at the word lines of a static random access memory (SRAM).

In general, in SRAMs, it is difficult to simultaneously satisfy the stability of data written to a memory cell and write characteristics. In other words, it is difficult to simultaneously realize prevention of read disturb and prevention of write failure.

Figure 9A:
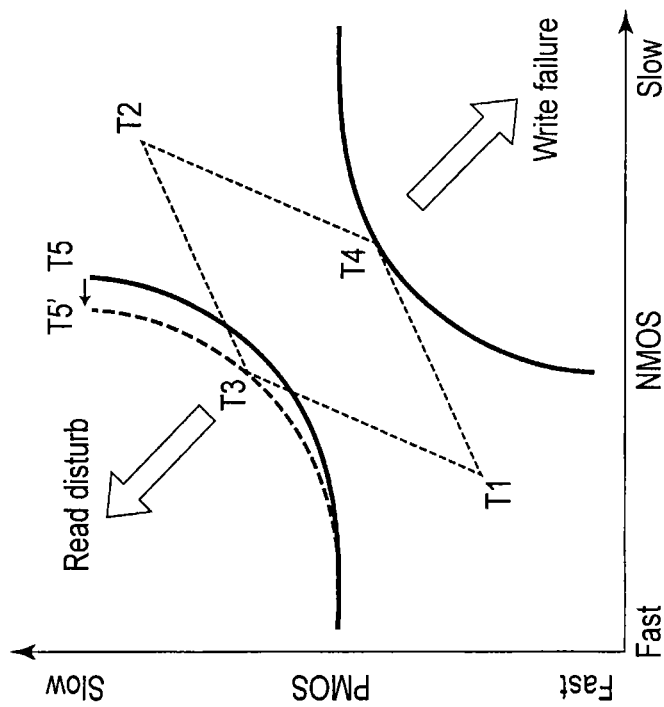
FIGS. 9A and 9B are graphs showing the performance of an NMOS transistor and a PMOS transistor that provides a static random access memory (SRAM) according to a second embodiment.
Figure 9B:
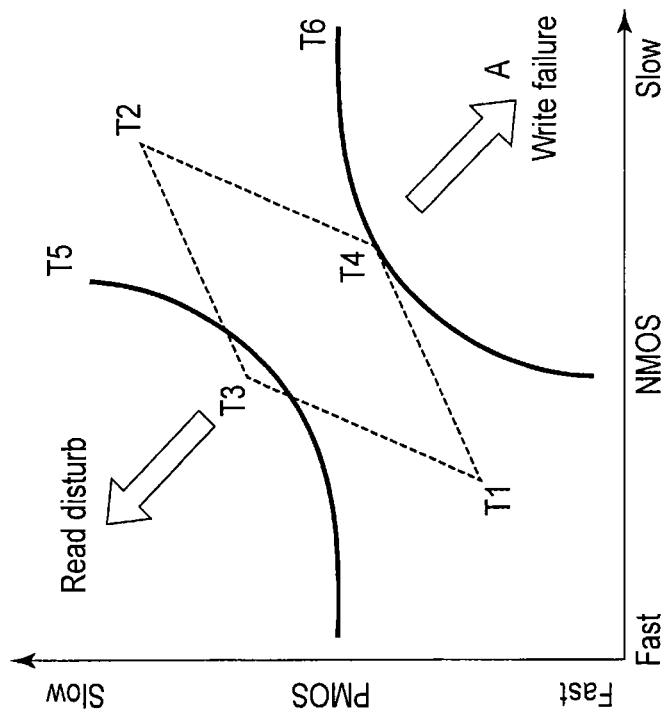

FIGS. 9A and 9B show the performance of PMOS and NMOS transistors that form an SRAM. In FIGS. 9A and 9B, the areas defined by the broken lines that are obtained by connecting points T1, T2, T3 and T4 indicate variations in SRAM process conditions.

T1 indicates a condition that the operation speeds of the NMOS and PMOS transistors are both high. In other words, it indicates a condition that the NMOS and PMOS transistors consume large amounts of current.

T2 indicates a condition that the operation speeds of the NMOS and PMOS transistors are both low. In other words, it indicates a condition that the NMOS and PMOS transistors consume small amounts of current.

T3 indicates a condition that the operation speed of the NMOS transistor is high and that of the PMOS transistor is low. In other words, it indicates a condition that the NMOS transistor consumes a large amount of current and the PMOS transistor consumes a small amount of current.

T4 indicates a condition that the operation speed of the NMOS transistors is low and that of the PMOS transistors is high. In other words, it indicates a condition that the NMOS transistor consumes a small amount of current and the PMOS transistor consumes a large amount of current.

In FIG. 9A, T5 indicates the boundary of an area in which a read disturb occurs, and T6 indicates the boundary of an area in which a write failure occurs. Namely, if the operation speed of the NMOS transistor is high and that of the PMOS transistor is low, the potential of the storage node of the SRAM may be inverted during data reading, and stored data be damaged. In contrast, if the operation speed of the NMOS transistor is low and that of the PMOS transistor is high, a data write failure will occur.

It is desirable that the performance of the PMOS and NMOS transistors that form the SRAM be within the area defined by the broken line obtained by connecting conditions T1 to T4.

However, in the SRAM shown in FIG. 9A, condition T3 traverses the boundary T5 of the area in which a read disturb occurs. Accordingly, under condition T3, a read disturb occurs. To prevent it, it is necessary to decrease the operation speed of the NMOS transistor, and to increase the operation speed of the PMOS transistor. Namely, condition T3 can be moved to the outside of the boundary T5 of the area in which a read disturb occurs, by moving the area defined by the broken line obtained by connecting condition points T1 to T4 to the direction indicated by arrow A. In this case, however, condition T4 traverses the boundary T6 of the area in which a write failure occurs, with the result that a write failure will occur. Thus, the read disturb and write failure is in a trade-off relationship, and hence it was difficult so far to improve both the read disturb and write failure.

In view of the above, in the second embodiment, the word line level is controlled in accordance with PVT, as in the first embodiment. Namely, part of the row decoder of the SRAM is made to have a structure as shown in FIG. 2, and control is performed by the timing shown in FIG. 3. The SRAM is formed of, for example, six transistors, and a word line connected to the gate electrodes of two transfer transistors connected between a pair of bit lines and between a pair of storage nodes is controlled by the timing shown in FIG. 3.

FIG. 9B shows the characteristics of NMOS and PMOS transistors forming the SRAM according to the second embodiment. In the second embodiment, the boundary of the area in which a read disturb occurs is shifted from T5 to T5' by controlling the word line of the SRAM in the same way as in the first embodiment. Namely, the driving force of the transfer transistor formed of NMOS transistor and connected to the word line is reduced by setting the potential of the word line to Vdd lower than power supply voltage VDD. Thereby, the conditions T1 to T4 of the NMOS and PMOS transistors can be maintained, and the operation speed of the NMOS transistor can be lowered. Consequently, read disturb can be prevented during data reading.

Where condition T4 traverses boundary T6 of the area in which a write failure occurs, the write failure can be prevented by setting the potential of the word line to the high level in accordance with PVT to thereby increase the current driving force of the NMOS transistor. However, this is irrelevant to the subject matter of the embodiment, and hence no description will be given thereof.

In the above-described second embodiment, by setting the potential of the word line to Vdd lower than power supply voltage VDD in accordance with PVT, the current driving force of the NMOS transistor forming the transfer transistor of the SRAM can be reduced. Consequently, occurrence of a write failure can be suppressed, and read disturb be prevented.

Moreover, since the charge of virtual power supply node VS1 for driving the word line is left because of the prevention of leakage when the SRAM is not selected, the consumption of power in the standby state can be reduced.

Third Embodiment

The second embodiment is directed to suppression of read disturb in the SRAM and reduction of power consumption in the standby state. On the other hand, a third embodiment is directed to reduction of the power consumption of a logical circuit.

In the first embodiment, the described row decoder selects one word line corresponding to an address, and the column decoder selects one column selection line corresponding to the address. Accordingly, the row decoder and the column decoder use the same power to select the word line and the column selection line, respectively. Therefore, reduction in the potential of each of virtual power supply nodes VS1 and VS2 can be predicted.

In contrast, a logical circuit performs different operations for random input signals, and hence requires different amounts of power for processing the input signals. Therefore, it is difficult to estimate a potential reduction in virtual power supply node VS1 or VS2, unlike the first embodiment. In view of this, the third embodiment employs a clamp circuit for the virtual power supply node in order to prevent the potential of the virtual power supply node from excessively lowering.

Figure 10:
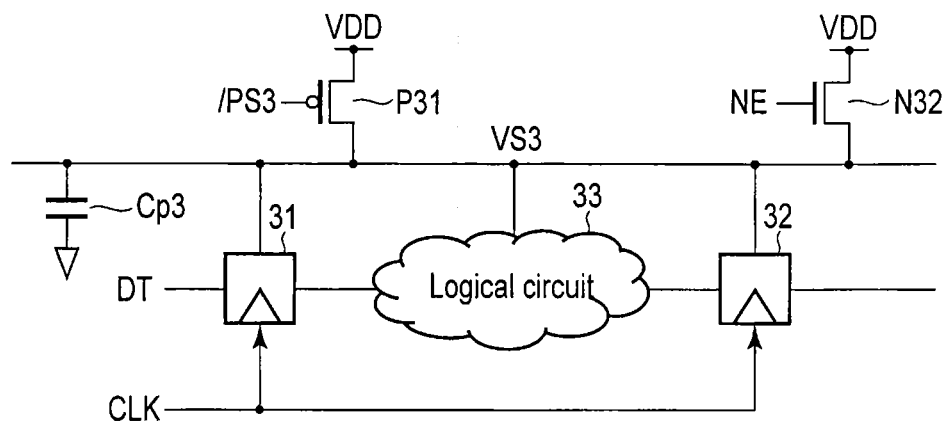
FIG. 10 is a schematic circuit diagram showing an example of a logical circuit according to a third embodiment.

FIG. 10 shows an example of the logical circuit according to the third embodiment. For instance, a logical circuit 33 is connected between flip-flop circuits 31 and 32. The flip-flop circuits 31 and 32 and the logical circuit 33 are connected to virtual power supply node VS3 to receive power therefrom. Input signal DT is supplied to an end of the flip-flop circuit 31, and is transferred to the logical circuit 33 and the flip-flop circuit 32 in synchronism with, for example, clock signal CLK.

PMOS transistor P31 is connected between a node supplied with power supply voltage VDD and virtual power supply node VS3, as in the first embodiment. The gate electrode of PMOS transistor P31 is supplied with signal/PS3.

Further, NMOS transistor N32 providing a clamp circuit is connected between another node supplied with power supply voltage VDD and virtual power supply node VS3. The gate electrode of NMOS transistor N32 is supplied with signal NE. Yet further, capacitor Cp3 is connected between virtual power supply node VS3 and the ground.

Figure 11:
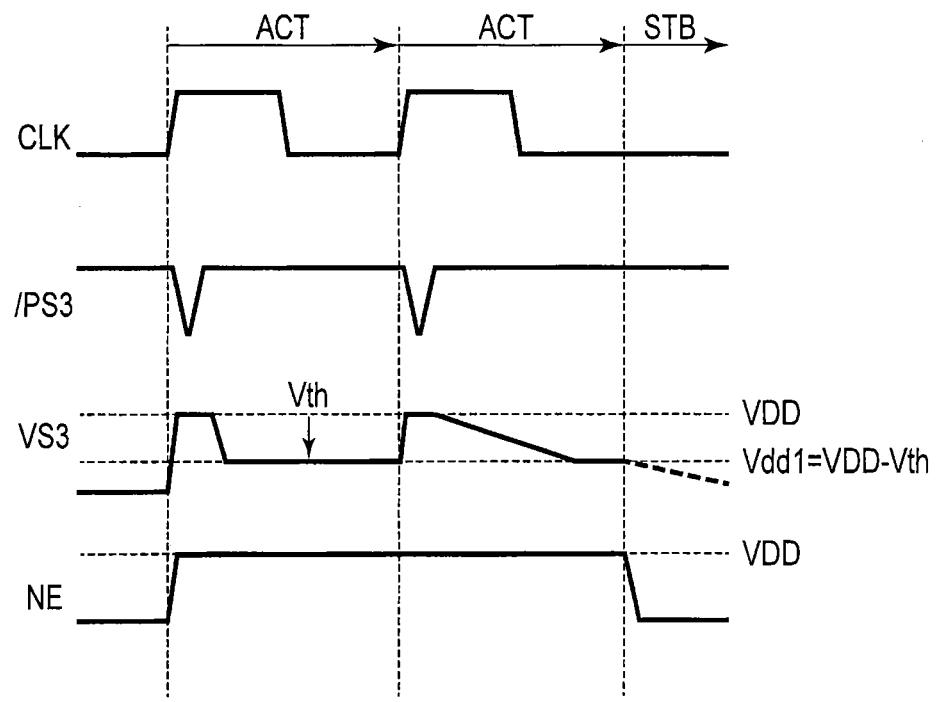
FIG. 11 is a waveform chart showing the operation of the circuit shown in FIG. 10.

FIG. 11 is a waveform chart showing the operation of the circuit of FIG. 10.

In active cycle ACT, when clock signal CLK becomes a high level, signal/PS3 becomes a low level for a short period of time and PMOS transistor P31 is turned on for the short period of time, thereby increasing virtual power supply node VS3 to power supply voltage VDD. Namely, virtual power supply node VS3 is charged with power supply voltage VDD in the initial stage of active cycle ACT.

Also, when clock signal CLK becomes the high level, signal NE becomes the high level. In a plurality of active cycles ACT, signal NE is set the high level continuously. When signal NE is at the high level, NMOS transistor N32 is turned on. In contrast, when virtual power supply node VS3 is at power supply voltage VDD, NMOS transistor N32 is in the off state and hence does not flow a current. In this state, the flip-flop circuits 31 and 32 and the logical circuit 33 operate to cause the charge of virtual power supply node VS3 to be shared between the flip-flop circuits 31 and 32 and the logical circuit 33, whereby the voltage at virtual power supply node VS3 is lowered. Since the logical circuit 33 operates in different ways for random input signals, the rate of reduction of the voltage at virtual power supply node VS3 varies in accordance with the operation of the logical circuit 33.

When the voltage at virtual power supply node VS3 is lowered to voltage Vdd1 (=VDD−Vth) that is lower than power supply voltage VDD by the threshold voltage Vth of the NMOS transistor, NMOS transistor N32 is turned on. Since signal NE is kept at the high level when the logical circuit 33 is in active cycle ACT, virtual power supply node VS3 is kept at voltage Vdd1 lower than power supply voltage VDD. Namely, NMOS transistor N32 clamps the voltage at virtual power supply node VS3, to Vdd1.

If there is no NMOS transistor N32, the charge of virtual power supply node VS3 is consumed by charge share, whereby the voltage at virtual power supply node VS3 may be lowered below voltage Vdd1, and the logical circuit 33 may become inoperable at worst. To avoid this, it is possible to increase the period of the on-state of PMOS transistor P31. In this case, however, it is necessary to set the period of the on-state of PMOS transistor P31 in accordance with a maximum power consumption because the power consumption of the logical circuit 33 cannot be estimated. Consequently, the power consumption is increased.

In contrast, in the third embodiment, the voltage at virtual power supply node VS3 is kept at Vdd1 by NMOS transistor N32, whereby the operation of the logical circuit 33 is maintained. Moreover, the voltage at virtual power supply node VS3 is lower than power supply voltage VDD, and therefore an increase in power consumption during active cycle ACT can be avoided.

If the state has shifted from active cycle ACT to standby state STB, clock signal CLK is held at the low level, signal/PS3 is held at the high level, and signal NE is held at the low level. As a result, both PMOS transistor P31 and NMOS transistor N32 are kept in the off state, thereby preventing a leak current in the standby state.

As described above, in the third embodiment, virtual power supply node VS3 is connected to PMOS transistor P31 set in the on state in the initial stage of active cycle ACT, and also connected to NMOS transistor N32 set so as to clamp virtual power supply node VS3 at Vdd1 (=VDD−Vth) lower than power supply voltage VDD after PMOS transistor P31 is turned off. Accordingly, virtual power supply node VS3 for supplying power to the logical circuit 33 is set to power supply voltage VDD in the initial stage of the active cycle, and is thereafter kept at Vdd1 lower than power supply voltage VDD. This structure enables the logical circuit 33 to continuously operate and at the same time prevents an increase in power consumption.

Moreover, since NMOS transistor N32 is kept in the off state in the standby state, the power consumption in the standby state can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first transistor of a first conductivity type connected between a first node to which a power supply voltage is applied and a second node, the first transistor being turned on in an initial stage of an active cycle to charge the power supply voltage to the second node, and thereafter being turned off; and
   a first logical circuit driven by the power supply voltage charged to the second node prior to the first transistor being turned off, after the first transistor is turned off, the first logical circuit outputting a voltage being lower than the power supply voltage in the active cycle based on an input signal supplied thereto.

2. The device according to claim 1, wherein
   the first logical circuit includes a first inverter circuit having an input terminal supplied with the input signal, and an output terminal;
   the input signal is an output signal output from a row decoder;
   the output terminal of the first inverter circuit is connected to a word line;
   the word line is connected to a gate electrode of a second transistor of a second conductivity type that selects a memory cell; and
   the word line drives the second transistor by the voltage lower than the power supply voltage output from the first inverter circuit.

3. The device according to claim 1, wherein
   the first logical circuit includes a second inverter circuit having an input terminal supplied with the input signal, and an output terminal;
   the input signal is an output signal output from a column decoder;
   the output terminal of the second inverter circuit is connected to a column selection line;
   the column selection line is connected to a gate electrode of a third transistor of a second conductivity type that selects a bit line connected to a memory cell; and
   the column selection line drives the third transistor by the voltage lower than the power supply voltage output from the second inverter circuit.

4. The device according to claim 2, wherein the memory cell includes a magnetoresistive effect element.

5. The device according to claim 3, wherein the memory cell includes a magnetoresistive effect element.

6. The device according to claim 1, further comprising a pulse generation circuit that varies a pulse width of a signal supplied to a gate electrode of the first transistor.

7. The device according to claim 5, further comprising a pulse generation circuit that varies a pulse width of a signal supplied to a gate electrode of the first transistor.

8. The device according to claim 3, further comprising a sense amplifier connected to the bit line and includes no clamp circuit.

9. The device according to claim 2, wherein the memory cell is a static RAM.

10. The device according to claim 1, further comprising a fourth transistor of a second conductivity type connected between the first and second nodes, the fourth transistor holds a voltage of the second node at a voltage being lower than the power supply voltage in the active cycle.

11. The device according to claim 10, wherein the first logical circuit comprises:
    first and second flip-flop circuits connected to the second node; and
    a second logical circuit connected between the first and second flip-flop circuits and connected to the second node.

12. The device according to claim 6, wherein the pulse generation circuit comprises:
    a fifth transistor of the first conductivity type having an end to which the power supply voltage is applied;
    a plurality of sixth transistors of a second conductivity type connected in series between another end of the fifth transistor and a ground, the fifth and sixth transistors having gate electrodes connected to a second input terminal, the another end of the fifth transistor being connected to a second output terminal; and
    a plurality of seventh transistors of the first conductivity type each having an end to which the power supply voltage is applied, the seventh transistors having other ends connected to respective connection nodes of the sixth transistors, the seventh transistors having gate electrodes connected to the second input terminal.

13. A semiconductor device comprising:
a memory cell connected to a word line and a bit line;
a row decoder connected to the word line; and
a column decoder connected to the bit line,
wherein the row decoder includes:
a first transistor of a first conductivity type connected between a first node to which a power supply voltage is applied and a second node, the first transistor being turned on in an initial stage of an active cycle to charge the power supply voltage to the second node, and thereafter being turned off; and
a first inverter circuit driven by the power supply voltage applied to the second node prior to the first transistor being turned off, after the first transistor is turned off, the first inverter circuit having an input terminal supplied with an input signal, the first inverter circuit having an output terminal connected to the word line, the first inverter circuit outputting a voltage being lower than the power supply voltage from the output terminal in the active cycle, based on the input signal.

14. The device according to claim 13, wherein the column decoder includes:
a third transistor of a first conductivity type connected between a third node to which the power supply voltage is applied and a fourth node, the first transistor being turned on in the initial stage of the active cycle to charge the power supply voltage to the fourth node, and thereafter being turned off; and
a second inverter circuit driven by the power supply voltage applied to the fourth node prior to the third transistor being turned off, after the third transistor is turned off, the second inverter circuit including an input terminal for receiving the input signal and an output terminal connected to a column selection line for selecting the bit line.

15. The device according to claim 14, further comprising a sense amplifier connected to the bit line and includes no clamp circuit.

16. The device according to claim 13, further comprising:
a fourth transistor of a first conductivity type connected between a fifth node to which the power supply voltage is applied and a sixth node, the fourth transistor being turned on in an initial stage of the active cycle and being turned off by applying the power supply voltage to the sixth node; and
a fifth transistor of a second conductivity type connected between the fifth node and the sixth node, the fifth transistor holding a voltage of the sixth node at a voltage being lower than the power supply voltage in the active cycle.

17. The device according to claim 16, further comprising a first flip-flop circuit and a second flip-flop circuit connected to the second node; and
a logical circuit connected between the first and second flip-flop circuits and connected to the sixth node.

18. The device according to claim 16, wherein the fifth transistor is a clamp circuit that holds a voltage of the sixth node at a voltage lower than the power supply voltage in the active cycle.

19. The device according to claim 13, wherein the memory cell includes one of a static RAM and a magnetoresistive effect element.

* * * * *